(12) United States Patent
Wang et al.

(10) Patent No.: US 7,655,997 B2
(45) Date of Patent: Feb. 2, 2010

(54) WAFER LEVEL ELECTRO-OPTICAL SEMICONDUCTOR MANUFACTURE FABRICATION MECHANISM AND A METHOD FOR THE SAME

(75) Inventors: Bily Wang, Hsin Chu (TW); Jonnie Chuang, Pan Chiao (TW); Chuan-Fa Lin, Shu Lin (TW); Chi-Wen Hung, Chung Li (TW)

(73) Assignee: Harvatek Corporation, Hsin Chu (TW)

( * ) Notice: Subject to any disclaimer, the term of this patent is extended or adjusted under 35 U.S.C. 154(b) by 0 days.

(21) Appl. No.: 11/041,952

(22) Filed: Jan. 26, 2005

(65) Prior Publication Data

US 2006/0166477 A1  Jul. 27, 2006

(51) Int. Cl.
*H01L 27/14* (2006.01)
(52) U.S. Cl. .................. 257/431; 257/91; 257/432; 257/433; 257/E33.057; 257/E27.12
(58) Field of Classification Search .............. 257/88, 257/89, 91, 100, 101, 431–433, E33.056, 257/E33.057, E33.059, E27.12, E25.032
See application file for complete search history.

(56) References Cited

U.S. PATENT DOCUMENTS

| | | | | |
|---|---|---|---|---|
| 5,864,062 A | * | 1/1999 | Nagahara et al. | 73/514.01 |
| 6,696,704 B1 | * | 2/2004 | Maeda et al. | 257/98 |
| 2005/0077531 A1 | * | 4/2005 | Kim | 257/98 |
| 2006/0198162 A1 | * | 9/2006 | Ishidu et al. | 362/623 |

* cited by examiner

*Primary Examiner*—Matthew E Warren
(74) *Attorney, Agent, or Firm*—Kile Goekjian Reed & McManus PLLC

(57) ABSTRACT

A wafer-level electro-optical semiconductor fabrication mechanism and method for the same which improves upon traditional electro-optical semiconductor grain packaging methods. The present invention electrically connects semiconductor grains to the grains on a top surface of a wafer, this is done by either screen-printing or steel board-printing solder or silver paste onto the wafer. After that, the wafer is processed using the following steps: processing the devices, bonding with wire, packaging the wafer and finally cutting the wafer. Using this method raises the production yield while production times and costs are reduced. The wafer-level electro-optical semiconductor fabrication mechanism comprises: a wafer, an electro-optical semiconductor grain and conductive materials.

11 Claims, 4 Drawing Sheets

WAFER LEVEL ELECTRO-OPTICAL SEMICONDUCTOR MANUFACTURE FABRICATION MECHANISM AND A METHOD FOR THE SAME

BACKGROUND OF THE INVENTION

1. Field of the Invention

The present invention relates to a wafer level electro-optical semiconductor manufacture fabrication mechanism and a method for the same. The present invention improves upon traditional electro-optical semiconductor grain packaging methods. The present invention uses screen-printing or steel board printing to print solder or silver paste onto the top surface of a wafer. The present invention does not necessitate the changing any other processes that need to take place subsequently in the traditional grain-packaging production line. Therefore, the device can be set in the substrate to attain a finer line than those of PCB boards. In this way, the device's size can be minimized and its performance raised. Also, the production yield can be improved to save on production time and costs. The present invention is especially suited to large sized LED grains or sensor packaging production lines.

2. Description of Related Art

Fabrication factories are always researching for new ways and methods to increase the production capacity of their electro-optical semiconductor packaging production lines. Most improvements are related to either process flows or are made through the deployment of new materials for lower production costs or faster production times. Process flow improvement is a very important subject. Owing to the precise machinery needed for grain packaging, the machinery is difficult to redesign and doing so is very expensive. As such, improving the process flow is relatively cheap and easily achievable.

IC substrates, such as BGA boards, CSP boards and flip chips, have all undergone vast improvements over recent years. Portable electric products are also becoming smaller and thinner, so IC substrates require thinner lines and smaller holes for their products.

Please refer to FIG. 1, which shows a traditional LED package mechanism 1a, substrate 10a connected to a LED 12a and a wire 14a, all packaged by a packaging material 16a. During the fabrication stage, there are many complex processes and efficiency problems with the traditional LED package mechanism 1a. In practice, the package 1a will affect the package's size, the product's performance and the yield. The traditional RGB grains can not be set close together because the traditional line width is too wide. Consequently, the light that is emitted will not be very bright. The same problem is also encountered in the sensor packaging field.

SUMMARY OF THE INVENTION

The major objective of the present invention relates to a wafer-level electro-optical semiconductor fabrication mechanism. It provides a new mechanism for use in electro-optical semiconductor packaging processes that lowers fabrication costs. The present invention can be used with an automatic semiconductor mechanism to provide low-cost, high-quality products with electro-optical semiconductor grain packaging applications.

The second objective of the present invention is to provide a wafer-level electro-optical semiconductor fabrication mechanism that produces the thin electrical lines and tiny fabrication structures needed for IC substrates.

The third objective of the present invention is to provide a wafer-level electro-optical semiconductor fabrication mechanism that can plant a demand module circuit in advance in the wafer thereby reducing the electro-optical device's volume. This will allow a single chip to be made into a module type chip or packaged into a semiconductor device.

The forth objective of the present invention is to provide a wafer-level electro-optical semiconductor fabrication mechanism, which dissipates heat better than current mechanisms by using a wafer substrate.

To achieve the objectives mentioned above, the present invention prints conductive materials upon a wafer. This overcomes two problems in the traditional packaging process—the large size of the substrate and the poor functioning of the circuit. The present invention also packages the electro-optical semiconductor grains by using a special packaging machine. The present invention also provides a more economical application of a semiconductor grain package mechanism than the method of the prior art.

The present invention also provides ESD (Electro Static Discharge) circuit over-voltage protection, voltage regulation, current regulation and noise filtering for the wafer.

The present invention comprises a wafer that has a top surface and bottom surface. The top surface has a plurality of preservation positions for covering the crystal grains, electro-optical crystal grains with contacts to electrically connect to the preservation position of the top surface, and a plurality of conductive materials located at the top surface of the wafer for electrically connecting the electro-optical crystal grain and the wafer.

The manufacture method of the present invention comprises the steps as follows: preparing a wafer with a preservation position for covering the jointed crystal grains; daubing a plurality of conductive materials onto the preservation position; stacking electro-optical semiconductors onto the conductive materials of the wafer; packaging the electro-optical semiconductor with a highly polymeric material to produce a semi-finished product; cutting the semi-finished product to form an electro-optical semiconductor mechanism.

The above summaries are intended to illustrate exemplary embodiments of the invention, which will be best understood in conjunction with the detailed description to follow, and are not intended to limit the scope of the appended claims.

BRIEF DESCRIPTION OF THE DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF PREFERRED EMBODIMENTS

Figure 1:
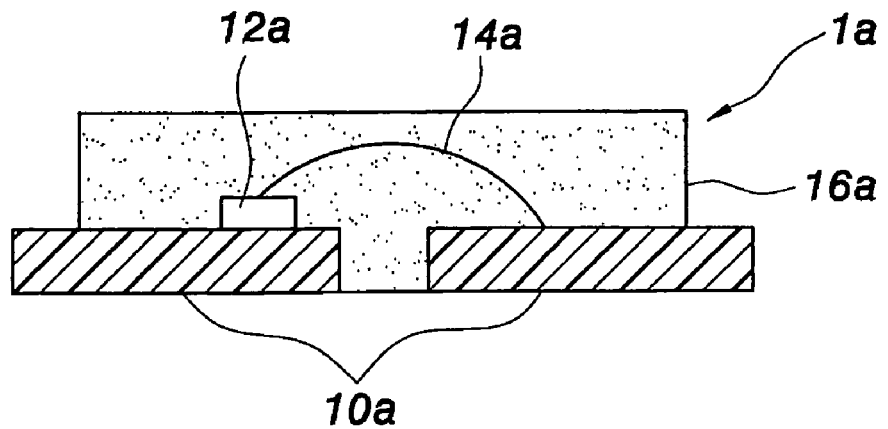
FIG. 1 shows a traditional LED package structure diagram.
Figure 2:
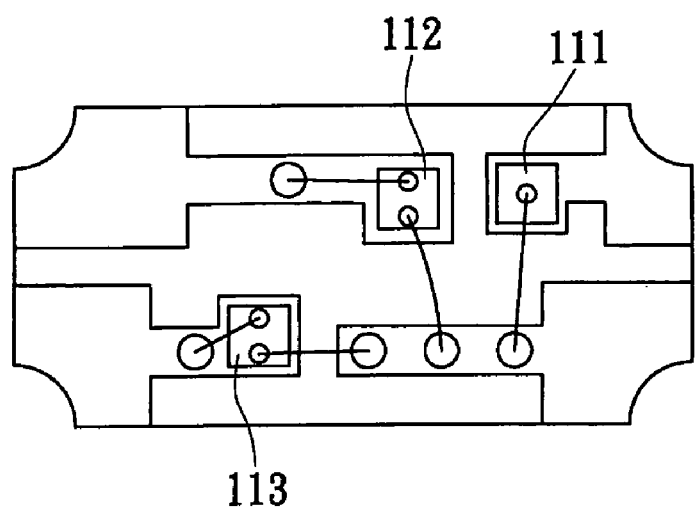
FIG. 2 shows a top view diagram of the traditional LED package structure.

The present method prints conductive materials onto the wafer, or a gold or tin projective block to simplify the grain-pasting step in the manufacturing method of an electro-optical semiconductor. The method of the present invention comprises the following steps: producing the wafer; setting the conductive material; stacking the electro-optical grain on top of the wafer (thereby eliminating the need for bonding line, which is usually made of gold); and finally packaging and cutting the electro-optical semiconductor. By printing the conductive materials onto the wafer, fewer distortions occur and the alignment of the material is improved. As such, the electro-optical semiconductor grain can be laid more easily. Compared with the peripheral assistant machine, the present invention is a more economical semiconductor grain packaging production system. It can also be used to place Zener diodes, over-voltage protection, voltage regulation, current regulation, noise filtering and electrical static discharge circuits upon the wafer in advance to improve the entire functioning of the electro-optical semiconductor.

The present invention comprises: a wafer with a top surface and a back surface; the top surface having a plurality of preservation positions for covering the jointed crystal grains and electro-optical semiconductor grains, and also has crystal joints which match with the preservation positions. There are also conductive materials in the top surface of the wafer. The electro-optical semiconductor can be a LED or an image sensor.

The manufacturing method of the present invention comprises the following steps: preparing a wafer 10 with a preservation position 18 for the grain joints; placing a conductive material 13 onto a preservation position 18; stacking electro-optical semiconductor grains 12 onto the conductive materials 13 of the wafer 10; packaging the electro-optical semiconductor grains 12 with highly polymeric materials to create a semi-finished product; cutting the semi-finished product to form an electro-optical semiconductor mechanism.

Figure 3:
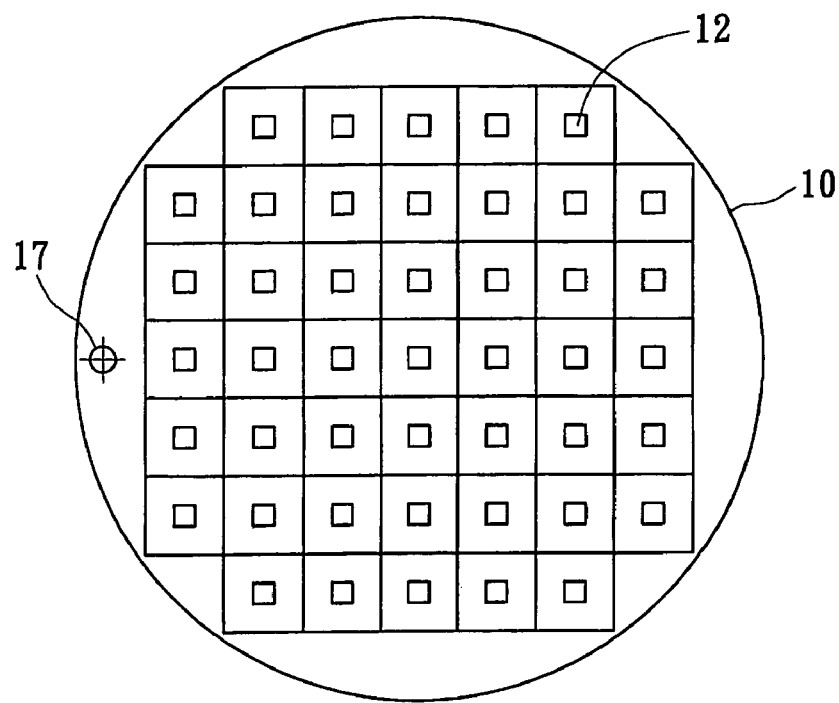
FIG. 3 show a top view diagram of the wafer level electro-optical semiconductor fabrication mechanism.
Figure 4:
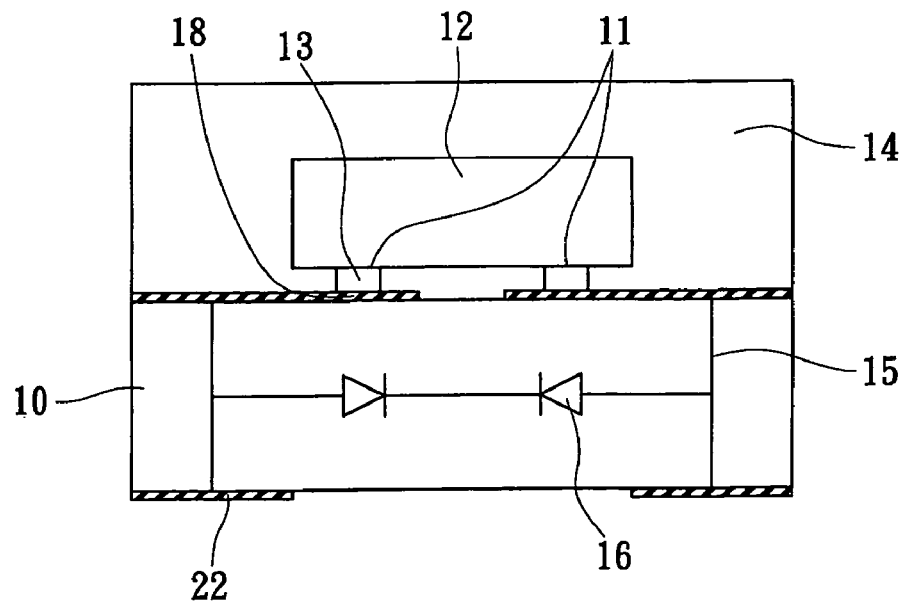
FIG. 4 shows a sectional diagram of the connection of the electro-optical semiconductor grain and wafer of the present invention.

FIG. 3 shows a top view diagram of an embodiment of the present invention wherein the top surface of the wafer 10 has a plurality of electro-optical semiconductor grains 12. FIG. 4 shows a sectional drawing of the electro-optical semiconductor grains 12 and the wafer 10. FIG. 4 shows a wafer 10 which has a top surface and a back surface, the top surface has a preservation position 18 for covering jointed crystal grains; the electro-optical semiconductor grains 12, which have a plurality of crystal joints 11 electrically connected to the preservation position 18; the conductive materials 13 which are located upon the top surface of the wafer 10 electrically connect to the electro-optical semiconductor grains 12.

Figure 5:
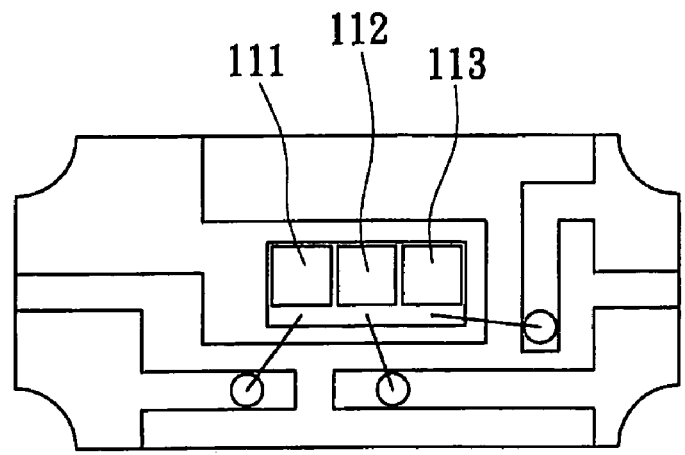
FIG. 5 shows a top view diagram of a RGB grain module of the present invention.
Figure 6:
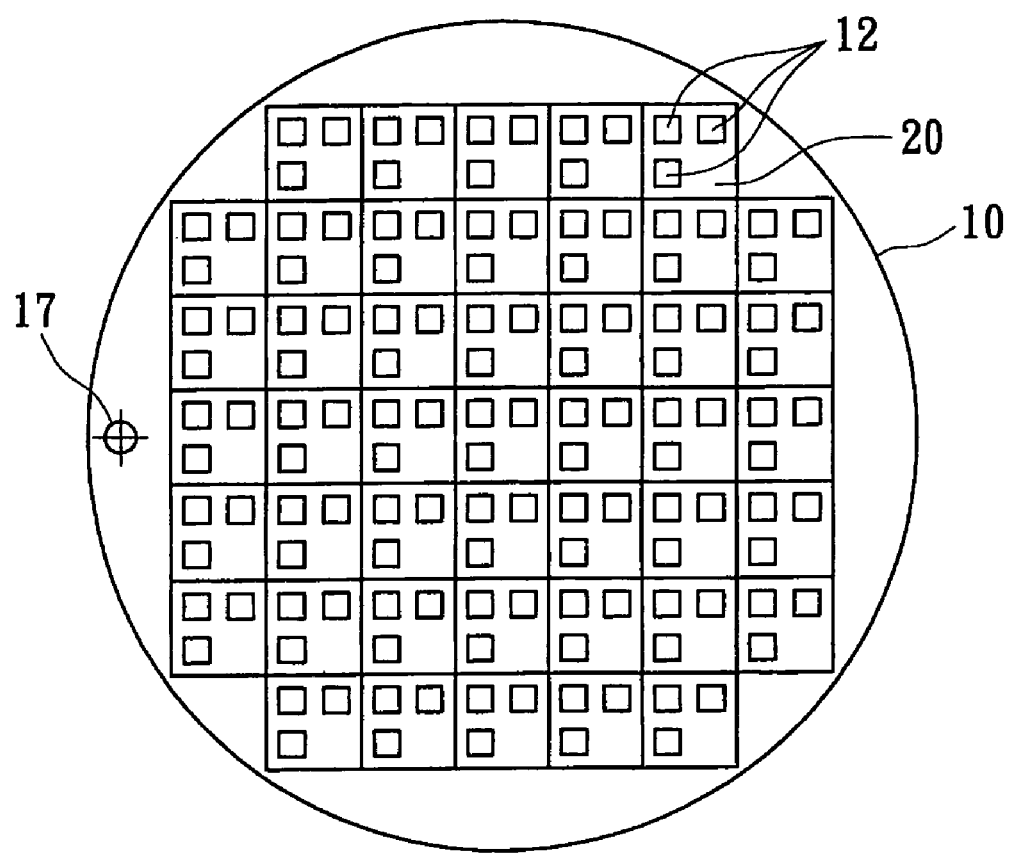
FIG. 6 shows another embodiment of the present invention.

Please refer to FIG. 4 to FIG. 6. FIG. 6 shows a wafer 10 with an orientation mark 17. FIGS. 4 and 5 have a conductive material 13 that is screen-printed upon the wafer 10. The thickness of the conductive material 13 is 10 μm to 50 μm. The crystal joint 11 can be located at the periphery, in the center or over the entire surface area. The top surface of the wafer 10 has an over voltage protection circuit 15 which is parallel to the electro-optical semiconductor grain 12. The over voltage protection circuit 15 is formed by cascading two opposite orientation over voltage protection diodes 16. The conductive material 13 is made with solder or silver paste.

Figure 5A:
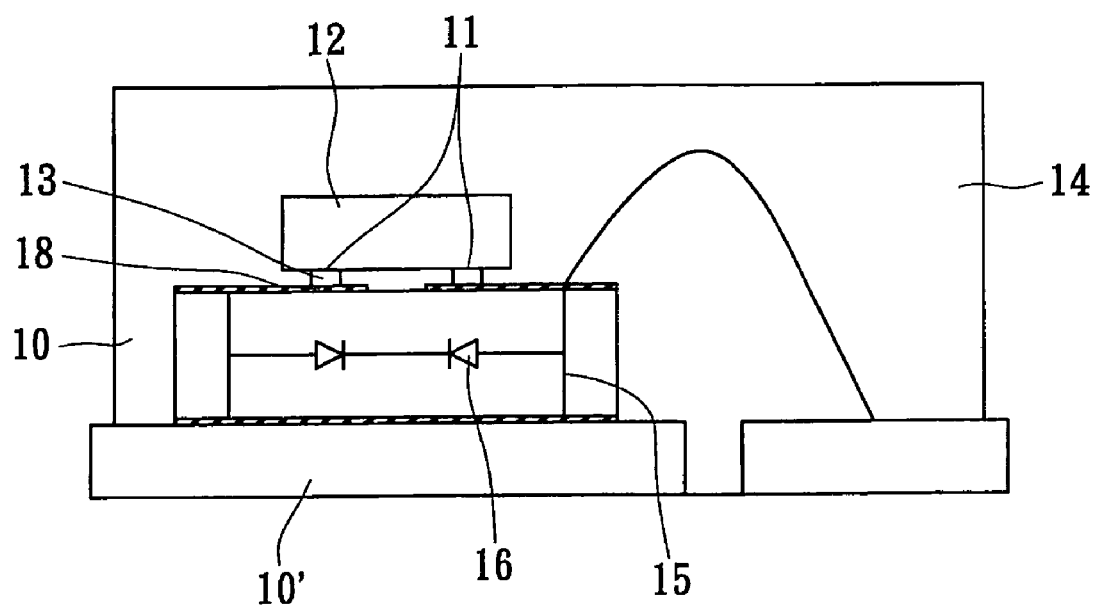
FIG. 5A shows a top view diagram of directly fabricating the RGB grain module of the present invention.

The electro-optical semiconductor grain 12 can be used as a LED. As shown in FIG. 5, a plurality of red, green, blue, ultraviolet or infrared ray semiconductor grains are set in a specific area to make a LED. The RGB semiconductor grain of the present embodiment can be manufactured by using the flip-chip method to produce a RGB grain module and electrically connecting it to the substrate 10' by bonding it with wires (shows as in FIG. 5A) or packaging it into device as in FIG. 4.

In FIG. 4, the back surface of the wafer 10 has a soldering portion 22. As such, the wafer 10 can act as the substrate and bonding with wire is not needed. In FIG. 6 another embodiment of the present invention is shown. In this embodiment, the present invention can sets the integrated circuit grains in a specific area and to be polycrystalline.

The present invention further comprises a highly polymeric packaging structure 14 surrounding the electro-optical semiconductor grains 12. The wafer 10 can also electrically connect to the electro-optical semiconductor by using a metal-metal eutectic or by using different melted metals such as gold-to-gold eutectic or gold to tin melting or tin-to-tin eutectic or melting.

Traditional PCB boards cannot function with lines that are thinner than 0.05 mm. However, wafers can function with a line width under 0.005 mm, thereby reducing the device's size drastically. An LED becomes brighter by reducing the distance between its individual grains. When this is done, the wafer substrate also dissipates heat more efficiently than traditional PCB boards thereby extending the product's user life.

The advantages of the present invention are as follows:

1. Better alignment and yield: the present invention is made by printing conductive materials and stacking electro-optical semiconductor grains onto the wafer thereby reducing alignment distortions and increasing yield.

2. Reducing the device's size: the electro-optical semiconductor grains are stacked onto the wafer, so the present invention can be packaged in wafer-level package.

3. Low cost process equipment: the process can be easily implemented as the equipment needed is both cheap and easily acquired.

4. Improved functionality: placing other circuits on the wafer such as over-voltage protection, voltage regulation, current regulation, noise filtering and electrical static discharge circuits.

Although the present invention has been described with reference to the preferred embodiment thereof, it should be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A wafer-level electro-optical semiconductor manufacture mechanism comprises:

a wafer which has a top surface and a back surface, wherein the top surface has a first preservation position and a second preservation position, the back surface has a first soldering portion and a second soldering portion a conductive circuit disposed inside the wafer and including an over-voltage protection with two over-voltage protection diodes, wherein the first preservation position and second preservation position are each respectively electrically connected to the first soldering portion and the second soldering portion by only the over-voltage protection;

electro-optical crystal grains having a first crystal joint and a second crystal joint, wherein the first crystal joint and the second crystal joint are electrically contacted to the first preservation position and the second preservation position respectively without outer wire bonding; and a plurality of conductive materials located at the top surface of the wafer for electrically connecting the electro-optical crystal grain and the wafer.

2. The wafer-level electro-optical semiconductor manufacture mechanism as in claim 1, wherein the contact between the wafer and the electro-optical crystal grains can be made of a metal eutectic or melting different metals, a gold-tin or a tin-tin melting connection.

3. The wafer-level electro-optical semiconductor manufacture mechanism as in claim 1, wherein the connection between the wafer and the electro-optical crystal grains can be a gold to gold eutectic, a gold to tin melting connection or a tin to tin eutectic or a melting connection.

4. The wafer-level electro-optical semiconductor manufacture mechanism as in claim 1, wherein the first and the second preservation positions are located in the center, on the periphery or over the entire area of the electro-optical semiconductor.

5. The wafer-level electro-optical semiconductor manufacture mechanism as in claim 1, wherein the conductive circuit includes voltage regulation, current regulation, noise filtering and electrical static discharge circuits which are disposed at a parallel position with the electro-optical semiconductor grain.

6. The wafer-level electro-optical semiconductor manufacture mechanism as in claim 1, wherein the over-voltage protection is formed by the two over-voltage protection diodes electrically connected together cascading in opposite directions.

7. The wafer-level electro-optical semiconductor manufacture mechanism as in claim 1, wherein the conduction materials are made of solder or silver paste.

8. The wafer-level electro-optical semiconductor manufacture mechanism as in claim 1, wherein the electro-optical semiconductor grain comprises a plurality of red, green, blue LEDs, ultraviolet light or infrared LEDs which are set in a particular area.

9. The wafer-level electro-optical semiconductor manufacture mechanism as in claim 1, further comprising a highly polymeric materials surrounding the electro-optical semiconductor grains.

10. The wafer-level electro-optical semiconductor manufacture mechanism as in claim 1, wherein the plurality of conductive materials are configured to provide electrical connections to the electro-optical crystal grains at any point along an upper surface of the plurality of conductive materials.

11. The wafer-level electro-optical semiconductor manufacture mechanism as in claim 1, wherein the first and the second soldering portions are separately disposed on the back surface of the wafer.

* * * * *